(12) United States Patent
Chiang et al.

(10) Patent No.: US 8,293,570 B2
(45) Date of Patent: Oct. 23, 2012

(54) METHOD FOR MANUFACTURING LIGHT EMITTING DEVICE

(75) Inventors: Yuan-Ming Chiang, Taoyuan County (TW); Wen-Hao Wu, Taipei County (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 13/433,301

(22) Filed: Mar. 29, 2012

(65) Prior Publication Data

US 2012/0184059 A1    Jul. 19, 2012

Related U.S. Application Data

(62) Division of application No. 13/025,181, filed on Feb. 11, 2011, now Pat. No. 8,174,008.

(30) Foreign Application Priority Data

Nov. 10, 2010   (TW) ................................ 99138682 A

(51) Int. Cl.
    *H01L 21/20* (2006.01)
(52) U.S. Cl. ........ 438/99; 438/34; 438/35; 257/E21.007
(58) Field of Classification Search ................... 438/34, 438/35, 99; 257/E21.007
    See application file for complete search history.

(56) References Cited

U.S. PATENT DOCUMENTS

2009/0309108 A1*  12/2009  Chang et al. .................... 257/89

* cited by examiner

*Primary Examiner* — Minchul Yang
(74) *Attorney, Agent, or Firm* — Jianq Chyun IP Office

(57) ABSTRACT

A light emitting device includes a substrate and a plurality of pixel rows. The pixel rows are arranged on the substrate. Each of the pixel rows includes a first sub-pixel row having a plurality of first sub-pixels, a second sub-pixel row having a plurality of second sub-pixels, and a third sub-pixel row having a plurality of third sub-pixels. In the $m^{th}$ pixel row, each first sub-pixel includes a first structure layer, the first structure layers are separated from each other and each corresponds to one first sub-pixel. In the $(m+n)^{th}$ pixel row, the first sub-pixels include a first common structure layer, the first common structure layer corresponds to a plurality of first sub-pixels in a same row. The first structure layer and the first common structure layer commonly act as an organic functional layer or an electrode layer, and m, n are each a positive integer.

10 Claims, 14 Drawing Sheets

METHOD FOR MANUFACTURING LIGHT EMITTING DEVICE

CROSS-REFERENCE TO RELATED APPLICATION

This application is a divisional of an application Ser. No. 13/025,181, filed on Feb. 11, 2011, now allowed, which claims the priority benefit of Taiwan application serial no. 99138682, filed on Nov. 10, 2010. The entirety of the above-mentioned patent applications are hereby incorporated by reference herein and made a part of specification.

BACKGROUND OF THE INVENTION

1. Field of the Invention

The present invention relates to a light emitting device and a method for manufacturing the light emitting device.

2. Description of Related Art

Information and communication industry has become the current main stream industry, especially for various portable communication and display products, which have become the development priority. Because flat displays are a communication interface between human and information, the development of flat displays becomes critically important. Organic electro-luminescent displays are one type of light emitting device. Because of the advantages of self-luminance, wide view angle, saving power, simple process, low cost, wide operation temperature range, high response speed and full colorization, the organic electro-luminescent displays have a very good prospect and are expected to be the main stream of next generation flat displays.

The organic electro-luminescent displays are a type of display that displays by taking advantage of self-luminance characteristics of organic electro-luminescent materials, which includes a first electrode layer, a second electrode layer, and an organic electro-luminescent material sandwiched between the first electrode layer and the second electrode layer. When supplied with a direct current voltage, holes are injected from the anode into the organic electro-luminescent material, while electrons are injected from the cathode into the organic electro-luminescent material. The voltage level difference caused by the applied electric field causes the two types of carriers—the holes and electrons—to move and produce radiative recombination in the organic electro-luminescent material. A part of the energy released by the hole-electron recombination excites the organic electro-luminescent material molecules to form excited-state molecules. When the excited-state molecules fall back to a ground state by releasing energy, a proportion of the energy is released in the form of photons thus creating light. This is the emitting principle of the organic electro-luminescent displays.

Following the large-size development of the organic electro-luminescent displays, the bottom-neck researchers are facing is that the size of the mask used in the evaporation process for the organic electro-luminescent displays is limited. Therefore, a combination-type mask must be used for the evaporation process, i.e. multiple masks are combined with the gap between adjacent masks corresponding to the area between sub-pixels or corresponding to the sub-pixels. However, in manufacturing the combination-type mask, it is not easy to control the fabrication precision of the edge portion of the mask as well as the combination precision of the masks. As a result, fabrication cost of the mask is high and the evaporation process requires a long time.

SUMMARY OF THE INVENTION

Accordingly, the present invention is directed to a light emitting device with an improved yield.

The present invention is also directed to a method for manufacturing a light emitting device which can simplify the process and reduce the manufacturing cost.

The present invention provides a light emitting device comprising a substrate and a plurality of pixel rows. The pixel rows are arranged on the substrate. Each of the pixel rows includes a first sub-pixel row having a plurality of first sub-pixels, a second sub-pixel row having a plurality of second sub-pixels, and a third sub-pixel row having a plurality of third sub-pixels. In the $m^{th}$ pixel row, each first sub-pixel includes a first structure layer, the first structure layers are separated from each other and each corresponds to one first sub-pixel. In the $(m+n)^{th}$ pixel row, the first sub-pixels include a first common structure layer, and the first common structure layer corresponds to a plurality of first sub-pixels in a same row. The first structure layer and the first common structure layer commonly act as an organic functional layer or an electrode layer, and m, n are each a positive integer.

The present invention additionally provides a method for manufacturing a light emitting device. A substrate is provided. The substrate includes a plurality of pixel areas. Each of the pixel areas includes a plurality of first sub-pixel areas arranged in row, a plurality of second sub-pixel areas arranged in row, and a plurality of third sub-pixel areas arranged in row. A mask is provided on the substrate. The mask includes a plurality of sub-mask units and a gap formed between each two adjacent sub-mask units. Each of the sub-mask units includes a main body with a plurality of openings. The main body shields the second sub-pixel areas and the third sub-pixel areas. The openings are arranged in row. Each opening exposes one first sub-pixel area corresponding to the opening. Each gap exposes a plurality of first sub-pixel areas in a same row corresponding to the gap. The width of each gap is at least larger than 25 um. Through the mask, a first structure layer is formed in each first sub-pixel area corresponding to one opening, and a first common structure layer is formed in each plurality of first sub-pixel areas in a same row corresponding to one gap. The first structure layer and the first common structure layer commonly act as an organic functional layer or an electrode layer.

In view of the foregoing, in the light emitting device of the present invention, the structure layer and the common structure layer form an organic functional layer or an electrode layer. One structure layer corresponds to one sub-pixel, and one common structure layer corresponds to a plurality of sub-pixels in a same row. The method for fabricating the light emitting device uses a mask having a plurality of sub-mask units, with the gap between the sub-mask units corresponding to a row of sub-pixel areas. The sub-mask unit includes a plurality of openings to define the structure layers, and the gap between the sub-mask units is used to define the common structure layer. As such, the fabrication of the sub-mask units is made easier, and the combination precision of the sub-mask units can be relatively easily controlled. Therefore, the time of fabricating the light emitting device and the fabrication cost of the mask can be significantly reduced, and the fabricated light emitting devices has an improved yield.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purposes of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
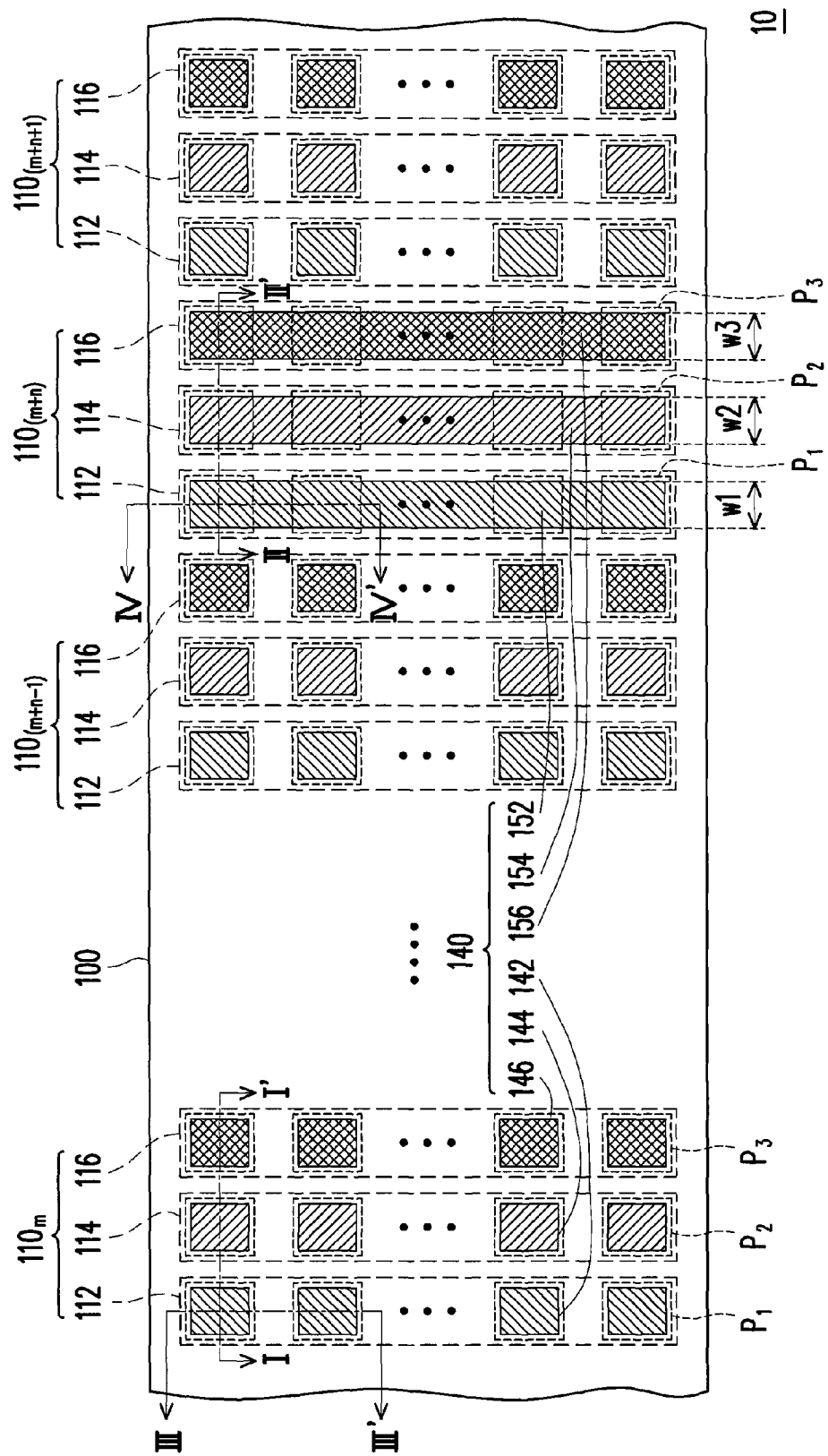
FIG. 1A is a top view of a light emitting device according to one embodiment of the present invention.
Figure 1B:
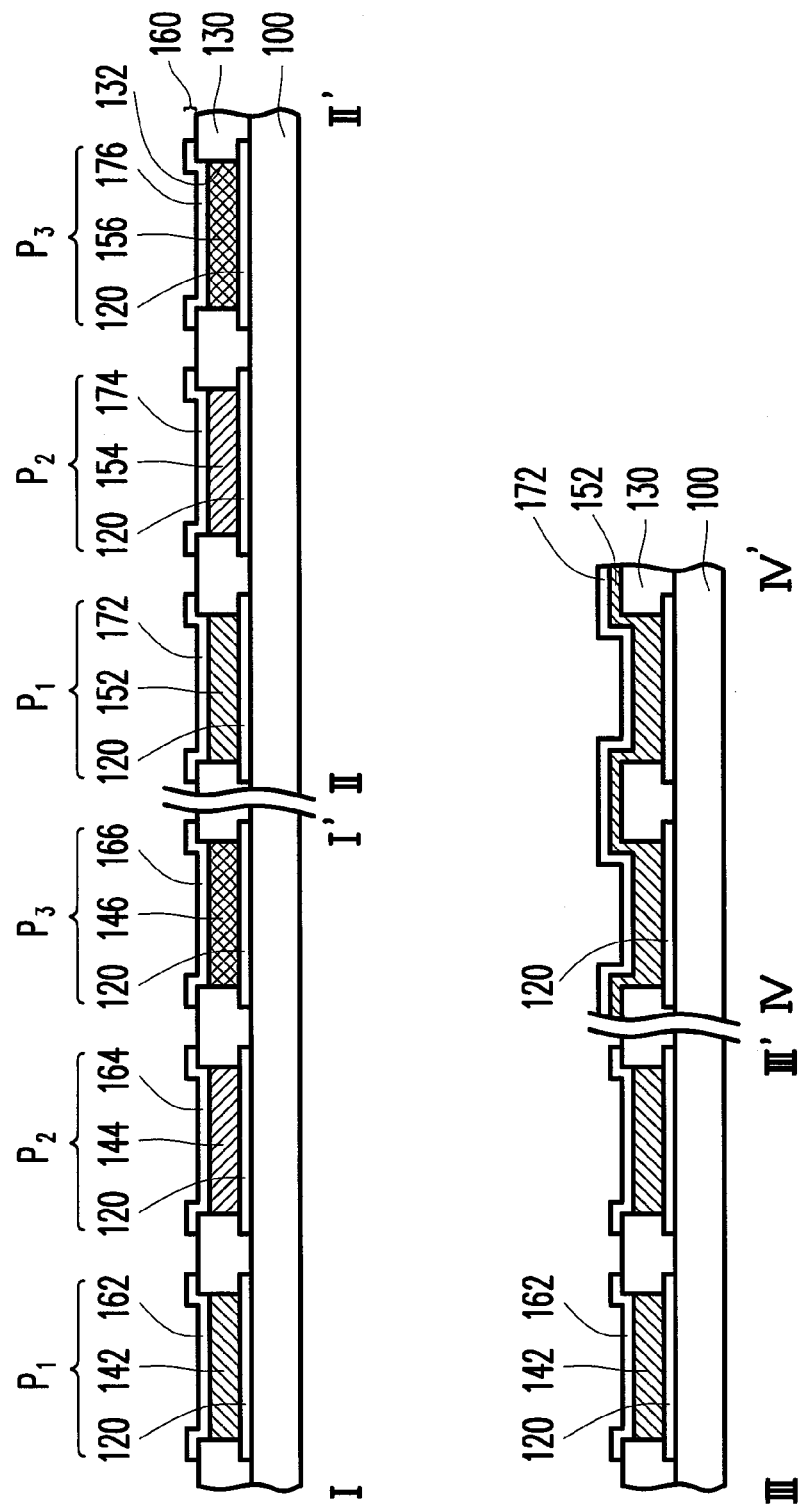
FIG. 1B is a cross-sectional view of FIG. 1A taken along lines I-I', II-II', III-III' and IV-IV' thereof.

FIG. 1A is a top view of a light emitting device according to one embodiment of the present invention. FIG. 1B is a cross-sectional view of FIG. 1A taken along lines I-I', II-II', III-III' and IV-IV' thereof, wherein, for the sake of detailed explanation, structure layers 142, 144, 146 and common structure layers 152, 154, 156 of sub-pixels $P_1$, $P_2$, $P_3$ are not depicted in FIG. 1A, and cross-sections of the complete structure of sub-pixels $P_1$, $P_2$, $P_3$ are depicted in FIG. 1B. Referring to FIG. 1A and FIG. 1B, in the present embodiment, the light emitting device 10 includes a substrate 100 and a plurality pixel rows $110_m$, $110_{(m+n+1)}$, $110_{(m+n)}$, $110_{(m+n+1)}$. The pixel rows $110_m$, $110_{(m+n+1)}$, ..., $110_{(m+n)}$, $110_{(m+n+1)}$ are arranged on the substrate 100. Each of the pixel rows $110_m$, $110_{(m+n+1)}$, $110_{(m+n)}$, $110_{(m+n+1)}$ includes a first sub-pixel row 112, a second sub-pixel row 114 and a third sub-pixel row 116. The first sub-pixel row 112 includes a plurality of first sub-pixels $P_1$, the second sub-pixel row 114 includes a plurality of second sub-pixels $P_2$, and the third sub-pixel row 116 includes a plurality of third sub-pixels $P_3$. In the present embodiment, the plurality of first sub-pixels $P_1$, the plurality of second sub-pixels $P_2$, and the plurality of third sub-pixels $P_3$ are, for example, a plurality of red sub-pixels, a plurality of green pixel rows, and a plurality of blue pixel rows, respectively.

It should be noted that, in the present invention, the first structure layer and the first common structure layer can commonly act as an organic functional layer or an electrode layer. The electrode layer is, for example, a cathode layer or an anode layer. In other words, in the light emitting device, the first structure layer and the first common structure layer can commonly act as at least one of the anode layer, the organic functional layer, and the cathode layer. In the present embodiment, the light emitting device 10 is illustrated as comprising a first structure layer 142 and a first common structure layer 152 commonly acting as an organic functional layer, and another first structure layer 162 and another first common structure layer 172 commonly acting as an electrode layer. In other words, in the present embodiment, the first structure layer 142 and the first common structure layer 152 are defined as the organic functional layer, and the another first structure layer 162 and the another first common structure layer 172 are defined as the electrode layer.

In the $m^{th}$ pixel row $110_m$, each first sub-pixel $P_1$ includes a first structure layer 142; the first structure layers 142 are separated from each other and each corresponds to one of the plurality of first sub-pixels $P_1$; in the $(m+n)^{th}$ pixel row $110_{(m+n)}$, the plurality of first sub-pixels $P_1$ includes a first common structure layer 152 which corresponds to the plurality of first sub-pixels $P_1$ in the same row, wherein the first structure layer 142 and the first common structure layer 152 commonly act as an organic functional layer and both m and n are positive integers. In the present embodiment, the first structure layer 142 and the first common structure layer 152 act, for example, as an organic functional layer such as a hole injection layer, a hole transport layer, an organic electro-luminescent layer, an electron injection layer and an electron transport layer.

Similarly, in the $m^{th}$ pixel row $110_m$, each first sub-pixel $P_1$ includes a first structure layer 162; the first structure layers 162 are separated from each other and each corresponds to one of the plurality of first sub-pixels $P_1$; in the $(m+n)^{th}$ pixel row $110_{(m+n)}$, a plurality of first sub-pixels $P_1$ includes a first common structure layer 172 which corresponds to the plurality of first sub-pixels $P_1$ in the same row, wherein the first structure layer 162 and the first common structure layer 172 commonly act as an electrode layer and both m and n are positive integers. In the present embodiment, the first structure layer 162 and the first common structure layer 172 act, for example, as an electrode layer. The electrode layer may be a cathode layer or an anode layer. The material of the electrode layer is, for example, non-transparent metal or transparent metal. The non-transparent metal material includes copper, aluminium, silver, gold, titanium, molybdenum, tungsten, chromium and any combination or lamination thereof. The transparent metal material includes metal oxide layer, such as, indium-tin oxide, indium-zinc oxide, aluminium-tin oxide, aluminium-zinc oxide, indium-germanium-zinc oxide, another suitable metal oxide, or a lamination of at two materials described above.

It is noted that, in the present embodiment, the first sub-pixel $P_1$ includes the first structure layer 142 and the first common structure layer 152 that act as the organic functional layer as well as another first structure layer 162 and another first common structure layer 172 that act as the electrode layer. However, in other embodiments, the first sub-pixel $P_1$ can include only the first structure layer 142 and the first common structure layer 152 that act as the organic functional layer, or only the first structure layer 162 and the first common structure layer 172 that act as the electrode layer. For example, in one embodiment, the first sub-pixel $P_1$ includes the first structure layer 142 and the first common structure layer 152 and an electrode layer with another configuration, or the first sub-pixel $P_1$ includes the first structure layer 162 and the first common structure layer 172 and an organic functional layer with another configuration.

In this exemplary embodiment, the first structure layer 162 and the first common structure layer 172 are described as a cathode layer. Therefore, the first sub-pixel $P_1$ further includes another electrode layer 120 acting as an anode layer. Specifically, in the $m^{th}$ pixel row $110_m$, the first sub-pixel $P_1$ includes the electrode layer 120 as the anode layer, the first structure layer 142 as the organic functional layer, and the first structure layer 162 as the cathode layer, which are sequentially stacked on the substrate 100. The first structure layer 142 is positioned between the electrode layer 120 and the first structure layer 162. That is, the first structure layers 142, 162 and the first sub-pixel $P_1$ are in a one-to-one correspondence relationship. The first structure layers 142 are arranged, for example, in an island-like pattern in the row direction, and the first structure layers 162 are arranged, for example, in an island-like pattern in the row direction.

On the other hand, in the $(m+n)^{th}$ pixel row $110_{(m+n)}$, the first sub-pixel $P_1$ includes an electrode layer 120, a first common structure layer 152, and a first common structure layer 172, which are sequentially stacked on the substrate 100. The plurality of first sub-pixels $P_1$ in the same row commonly include a first common structure layer 152 as the organic functional layer and a first common structure layer 172 as the cathode layer. In other words, in the $(m+n)^{th}$ pixel row $110_{(m+n)}$, the first common structure layers 152, 172 correspond to one first sub-pixel row 112, and the first common structure layers 152, 172 and the first sub-pixel $P_1$ are in a one-to-more correspondence relationship. The first common structure layers 152, 172 are, for example, strip-shaped and extend in the row direction. The first common structure layers 152, 172 have a width w1 that, for example, corresponds to the width of one first sub-pixel row 112. In the present embodiment, the width w1 of the first common structure layers 152, 172 ranges, for example, substantially from 120 um to 125 um.

In the present embodiment, the first common structure layers 152, 172 are positioned, for example, every n pixel rows, i.e. adjacent first common structure layers 152, 172 are spaced by, for example, n pixel rows. Specifically, each of the $(m-1)^{th}$ pixel row, the $(m+n)^{th}$ pixel row, the $(m+2n+1)^{th}$ pixel row, the $(m+3n+2)^{th}$ pixel row, and so on has the first common structure layer 152 and the first common structure layer 172 corresponding to one row of first sub-pixels $P_1$. On the other hand, each of the pixel rows from the $m^{th}$ to $(m+n-1)^{th}$, from the $(m+n+1)^{th}$ to $(m+2n)^{th}$, from the $(m+2n+2)^{th}$ to $(m+3n+1)^{th}$, ..., has the first structure layers 142 and the first structure layers 162 each corresponding to one first sub-pixel $P_1$. In the present embodiment, the distance between adjacent first common structure layers 152 or between adjacent first common structure layers 172 ranges, for example, substantially from 50 mm to 580 mm.

In the present embodiment, the second sub-pixels $P_2$ and the third sub-pixels $P_3$ are configured similarly to the first sub-pixels $P_1$. Specifically, in the $m^{th}$ pixel row $110_m$, each second sub-pixel $P_2$ includes a second structure layer 144 and a second structure layer 164; the second structure layers 144 are each separated from each other, the second structure layers 164 are separated from each other, and each of the second structure layers 144, 164 corresponds to one of the plurality of second sub-pixels $P_2$; in the $(m+n)^{th}$ pixel row $110_{(m+n)}$, a plurality of second sub-pixels $P_2$ includes a second common structure layer 154 and a second common structure layer 174 which each corresponds to the plurality of second sub-pixels $P_2$ in the same row, wherein the second structure layer 144 and the second common structure layer 154 commonly act as one of an organic functional layer and an electrode layer, the second structure layer 164 and the second common structure layer 174 commonly act as the other of the organic functional layer and the electrode layer, and the electrode layer is, for example, a cathode layer or an anode layer. In the present embodiment, the second structure layer 144 and the second common structure layer 154 act, for example, as an organic functional layer, and the second structure layer 164 and the second common structure layer 174 act, for example, as a cathode layer. Therefore, the second sub-pixel $P_2$ further includes another electrode layer 120 as the anode layer. Specifically, in the $m^{th}$ pixel row $110_m$, the second sub-pixel $P_2$ includes the cathode layer 120 as the anode layer, the second structure layer 144 as the organic functional layer, and the second structure layer 164 as the cathode layer, which are sequentially stacked on the substrate 100. In the $(m+n)^{th}$ pixel row $110_{(m+n)}$, the second sub-pixel $P_2$ includes the cathode layer 120 as the anode layer, the second common structure layer 154 as the organic functional layer, and the second common structure layer 174 as the cathode layer, which are sequentially stacked on the substrate 100. The width w2 of the second common structure layers 154, 174 ranges, for example, substantially from 120 um to 125 um. Adjacent second common structure layers 154 and adjacent second common structure layers 174 are each spaced by a distance of n pixel rows, for example, a distance ranging substantially from 50 mm to 580 mm.

In the present embodiment, in the $m^{th}$ pixel row $110_m$, each third sub-pixel $P_3$ includes a third structure layer 146 and a third structure layer 166. The third structure layers 146 are each separated from each other, the third structure layers 166 are each separated from one another, and each of the second structure layers 146, 166 corresponds to one third sub-pixel $P_3$. In the $(m+n)^{th}$ pixel row $110_{(m+n)}$, a plurality of third sub-pixels $P_3$ includes a third common structure layer 156 and a third common structure layer 176. The third common structure layer 156 and the third common structure layer 176 correspond to a plurality of sub-pixels $P_3$ in the same row. The third structure layer 146 and the third common structure layer 156 commonly act as one of an organic functional layer and an electrode layer, the third structure layer 166 and the third common structure layer 176 commonly act as the other of the organic functional layer and the electrode layer, and the electrode layer is, for example, a cathode layer or an anode layer. In the present embodiment, the third structure layer 146 and the third common structure layer 156 act, for example, as an organic functional layer, and the third structure layer 166 and the third common structure layer 176 act, for example, as a cathode layer. Therefore, the third sub-pixel $P_3$ further includes an electrode layer 120 as an anode layer. Specifically, in the $m^{th}$ pixel row $110m$, the third sub-pixel $P_3$ includes the cathode layer 120 as the anode layer, the third structure layer 146 as the organic functional layer, and the third structure layer 166 as the cathode layer, which are sequentially stacked on the substrate 100. In the $(m+n)^{th}$ pixel row $110_{(m+n)}$, the third sub-pixel $P_3$ includes the electrode layer 120 as the anode layer, the third common structure layer 156 as the organic functional layer, and the third common structure layer 176 as the cathode layer, which are sequentially stacked on the substrate 100. The width w3 of the third common structure layers 156, 176 ranges, for example, substantially from 120 um to 125 um. Adjacent third common structure layers 156 and adjacent third common structure layers 176 are each spaced by a distance of n pixel rows, for example, a distance ranging substantially from 50 mm to 580 mm.

In the present embodiment, the first common structure layers 152, 172, the second common structure layers 154, 174, and the third common structure layers 156, 176 are, for example, in the same pixel $110_{(m+n)}$ and connected with each other to have an total width ranging substantially from 360 um to 375 um. In the present embodiment, the structure layers 142, 144, 146 and the common structure layers 152, 154, 156 form, for example, an organic layer 140, and the structure layers 162, 164, 166 and the common structure layers 172, 174, 176 form, for example, an electrode layer 160.

In the present embodiment, the light emitting device 10 further includes, for example, an insulation layer 130. The insulation layer 130 is disposed on the electrode layer 120 and has a plurality of openings 132 for exposing the electrode layer 120 of each sub-pixel $P_1$, $P_2$, $P_3$. The structure layers 142, 144, 146 and the common structure layers 152, 154, 156 are, for example, disposed in the openings 132. While the structure layers 142, 144, 146 and the common structure layers 152, 154, 156 are illustrated as being completely disposed in the openings 132 of the insulation layer 130 in FIG. 1B, it is noted that, in practice, the structure layers 142, 144, 146 and the common structure layers 152, 154, 156 can be disposed in the openings 132 of the insulation layer 130 and cover portions the insulation layer 130. On the other hand, the light emitting device 10 of the present invention does not necessarily include the insulation layer 130. In other words, in another embodiment, the insulation layer 130 may be removed. In addition, while the structure layers 162, 164, 166 and the common structure layers 172, 174, 176 are described as commonly acting as a cathode layer, and the structure layers 142, 144, 146 and the common structure layers 152, 154, 156 are described as commonly acting as an organic functional layer in the illustrated embodiment, the structure layers and common structure layers can commonly act as at least one, at least two, or at least three of an anode layer, an organic functional layer and a cathode layer. For instance, in another embodiment, the structure layers and common structure layers can commonly act as an anode layer, and the cathode layer and organic functional layer have a structure well know in the art. In other words, except for the film formed by the structure layers and common structure layers, other films can be structured as well known in the art.

In the present embodiment, the light emitting device includes an organic functional layer or a cathode layer formed by the structure layers and common structure layers, with one structure layer corresponding to one sub-pixel, one common structure layer corresponding to a plurality of sub-pixels in a same row, and the common structure layers being arranged periodically, for example. For example, in the present embodiment, the common structure layers are configured in the $(m-1)^{th}$ pixel row, the $(m+n)^{th}$ pixel row, the $(m+2n+1)^{th}$ pixel row, the $(m+3n+2)^{th}$ pixel row, . . . , and each corresponds to one row of sub-pixels, while the structure layers are configured in the sub-pixels other than the pixel rows where the common structure layers are configured.

In the following a method for manufacturing the light emitting device 10 of FIG. 1A and FIG. 1B is discussed. FIG. 2A to FIG. 2F are top views of a method for manufacturing a light emitting device according to one embodiment of the present invention, and FIG. 3A to FIG. 3F are cross-sectional views of FIG. 2A to FIG. 2F taken along lines I-I', II-II', III-III' and IV-IV' thereof. Referring to FIG. 2A to FIG. 3A, a substrate 100 is first provided. The substrate 100 includes a plurality of pixel areas 102. Each pixel area 102 has a plurality of first sub-pixel areas $PA_1$ arranged in row, a plurality of second sub-pixel areas $PA_2$ arranged in row, and a plurality of third sub-pixel areas $PA_3$ arranged in row. In the present embodiment, the plurality of first sub-pixel areas $PA_1$, the plurality of second sub-pixel areas $PA_2$ and the plurality of third sub-pixel areas $PA_3$ are, for example, predetermined regions for forming a plurality of red sub-pixels, a plurality of green sub-pixels, and a plurality of blue sub-pixels, respectively. The material of the substrate 100 can be glass, quartz, organic polymer, plastic, flexible plastic, opaque/reflective material, or the like.

In the present embodiment, the substrate 100 has already been formed with a plurality of electrode layers 120 each corresponding one sub-pixel area $PA_1$, $PA_2$, $PA_3$. The electrode layer 120 can be a cathode layer or an anode layer. The electrode layer 120 is, for example, a transparent electrode layer such as a metal oxide layer, for example, indium-tin oxide, indium-zinc oxide, aluminium-tin oxide, aluminium-zinc oxide, indium-germanium-zinc oxide, another suitable metal oxide, or a lamination of at two materials described above, or a thin metal layer or thin metal lamination having high transparency. In one embodiment, the electrode layer 120 may also be an opaque electrode. In addition, in the present embodiment, for example, an insulation layer 130 has been already formed on the electrode layer 120. The insulation material 130 has a plurality of openings 132 for exposing the electrode layers 120 of the sub-pixel areas $PA_1$, $PA_2$, $PA_3$. It is noted, however, that the present invention does not necessarily include the insulation layer 130. In other words, the formation of the insulation layer 130 can be omitted.

Figure 2A:
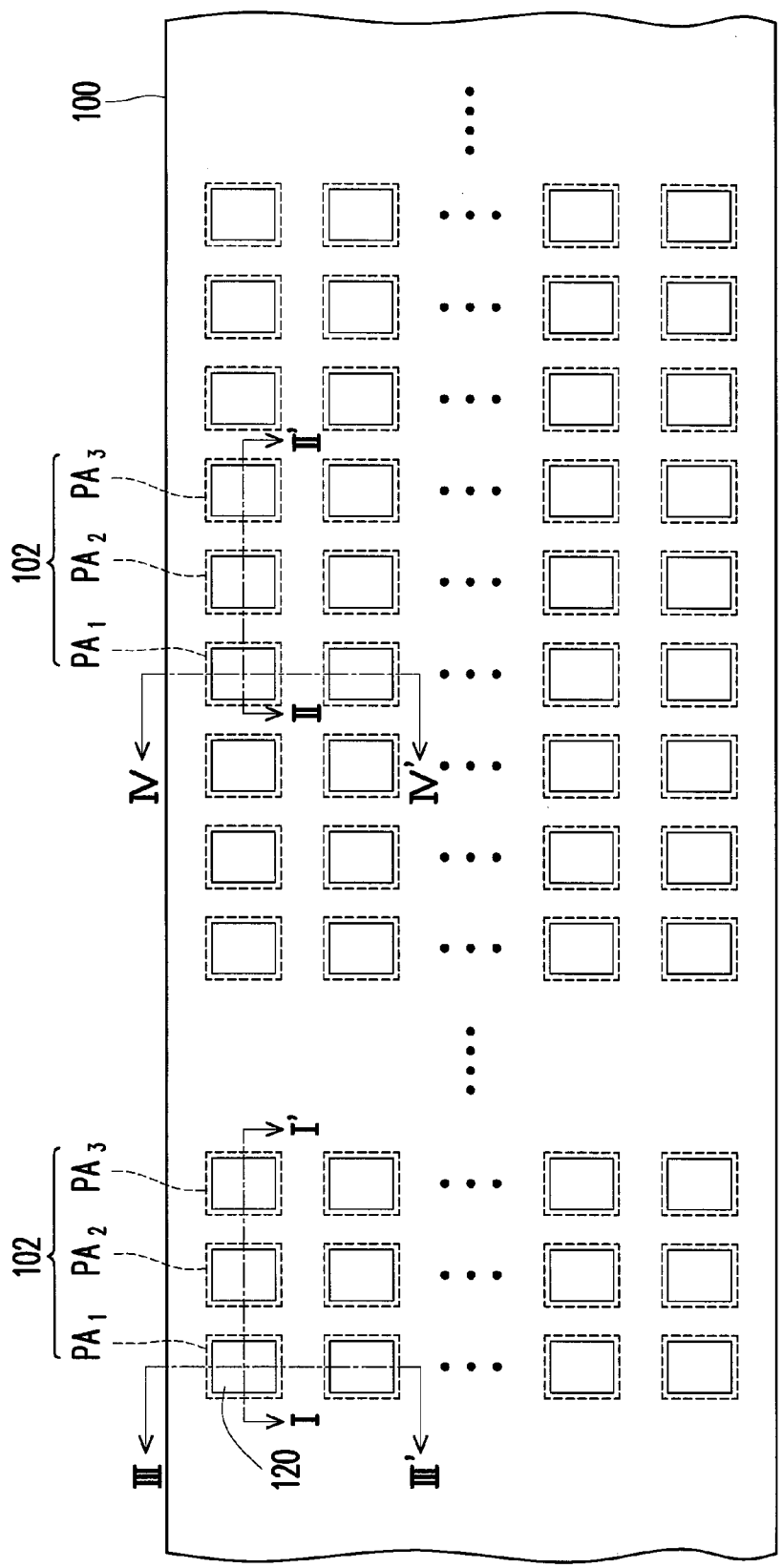
FIG. 2A to FIG. 2F are top views of a method for manufacturing a light emitting device according to one embodiment of the present invention.
Figure 2B:
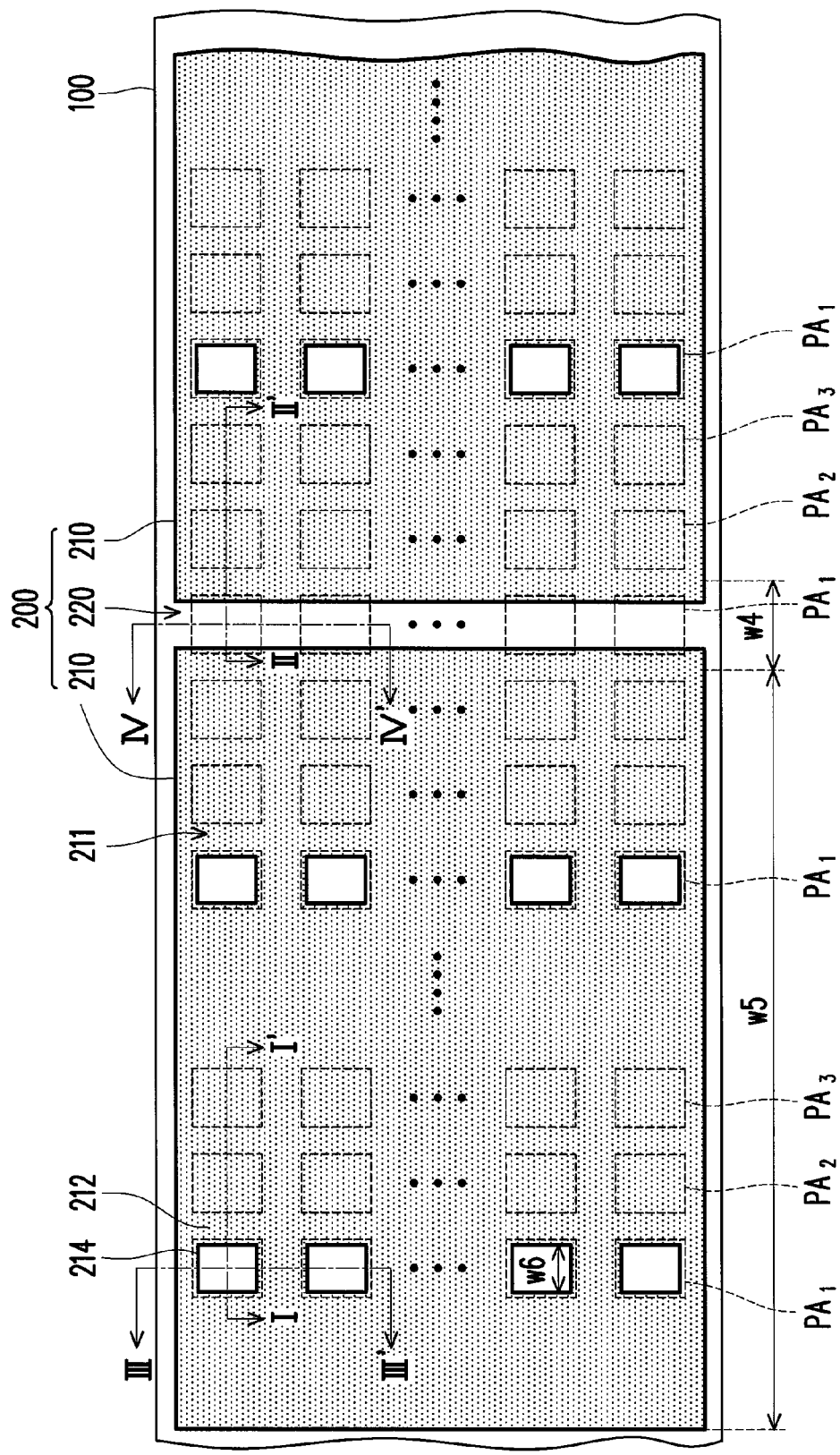
Figure 3A:
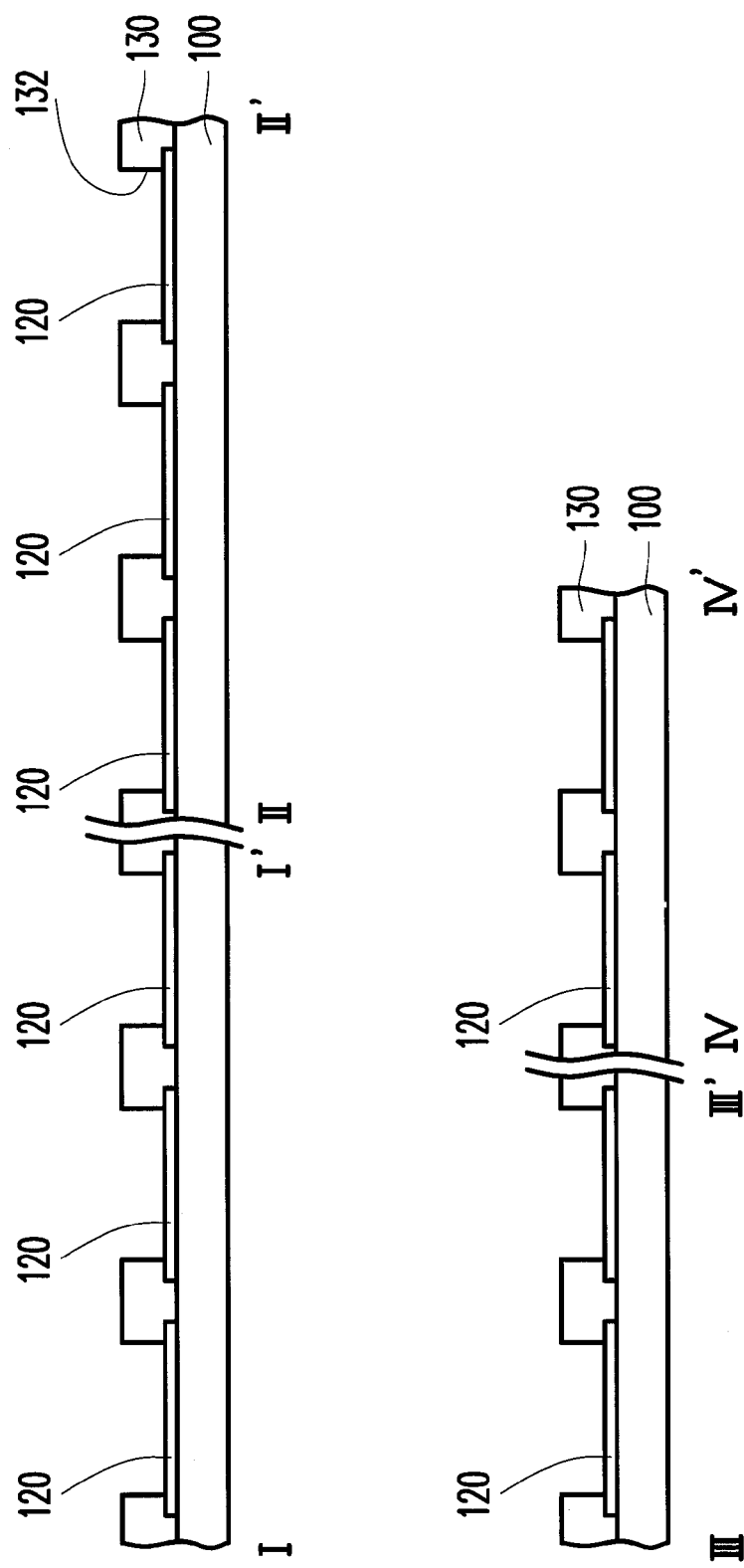
FIG. 3A to FIG. 3F are cross-sectional views of FIG. 2A to FIG. 2F taken along lines I-I', II-II', III-III' and IV-IV' thereof.
Figure 3B:
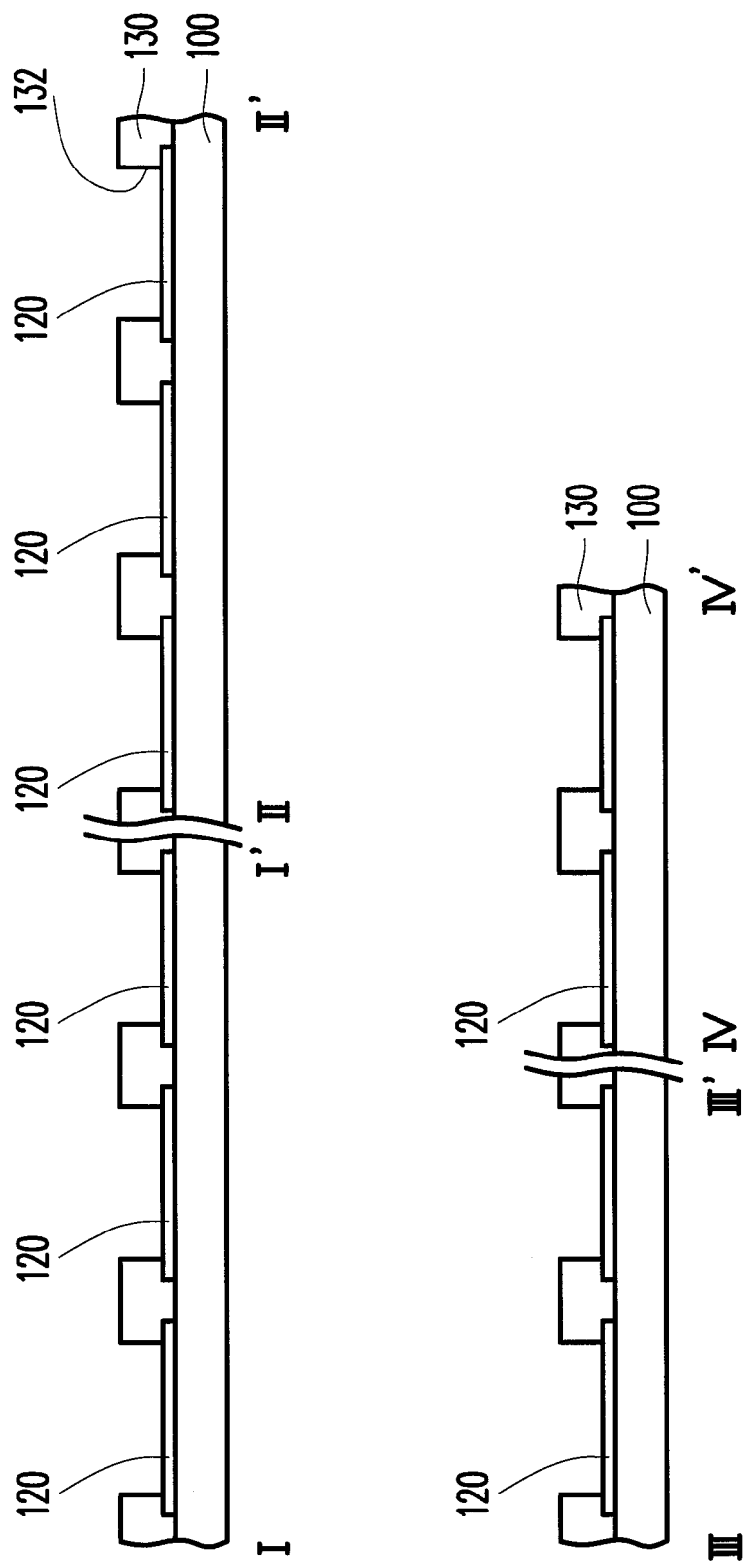

Referring to FIG. 2B and FIG. 3B, next, a mask 200 is provided on the substrate 100. The mask 200 includes a plurality of sub-mask units 210 and gaps 220 between adjacent sub-mask units 210. Each sub-mask unit 210 includes a main body 212 with a plurality of openings 214. The openings 214 are arranged in a plurality of rows and each opening 214 exposes one corresponding first sub-pixel area $PA_1$. The main body 212 shields the second sub-pixel areas $PA_2$ and third sub-pixel areas $PA_3$. The gap 220 exposes a plurality of corresponding first sub-pixel areas $PA_1$ in a same row. The width w4 of the gap 220 is at least larger than 25 um. In the present embodiment, each sub-mask unit 210 is, for example, disposed over n pixel areas 102. Each opening 214 of the sub-mask unit 210 exposes a corresponding one of the first sub-pixel areas $PA_1$ of the n pixel areas 102, the gap 220 between the sub-mask unit 210 exposes, for example, a plurality of first sub-pixel areas $PA_1$ in pixel areas 102 such as the $(m+n)^{th}$ pixel area 102, the $(m+2n+1)^{th}$ pixel area 102, . . . , or the like. In other words, each gap 220 exposes a plurality of sub-pixel areas $PA_1$ in the same row. In the present embodiment, the sub-mask unit 210 is, for example, disposed over n pixel areas 102, the width w5 of the sub-mask unit 210 ranges, for example, substantially from 50 mm to 580 mm, and the width w6 of the opening 214 ranges, for example, substantially from 120 um to 125 um. It is noted that a minimum of the width w4 of the gap 220 must be large enough to ensure a line width formed during evaporation process and sputtering process. Therefore, the width 4 is at least larger than 25 um. In the present embodiment, the width w4 of the gap 220 ranges, for example, substantially from 120 um to 125 um.

Figure 2C:
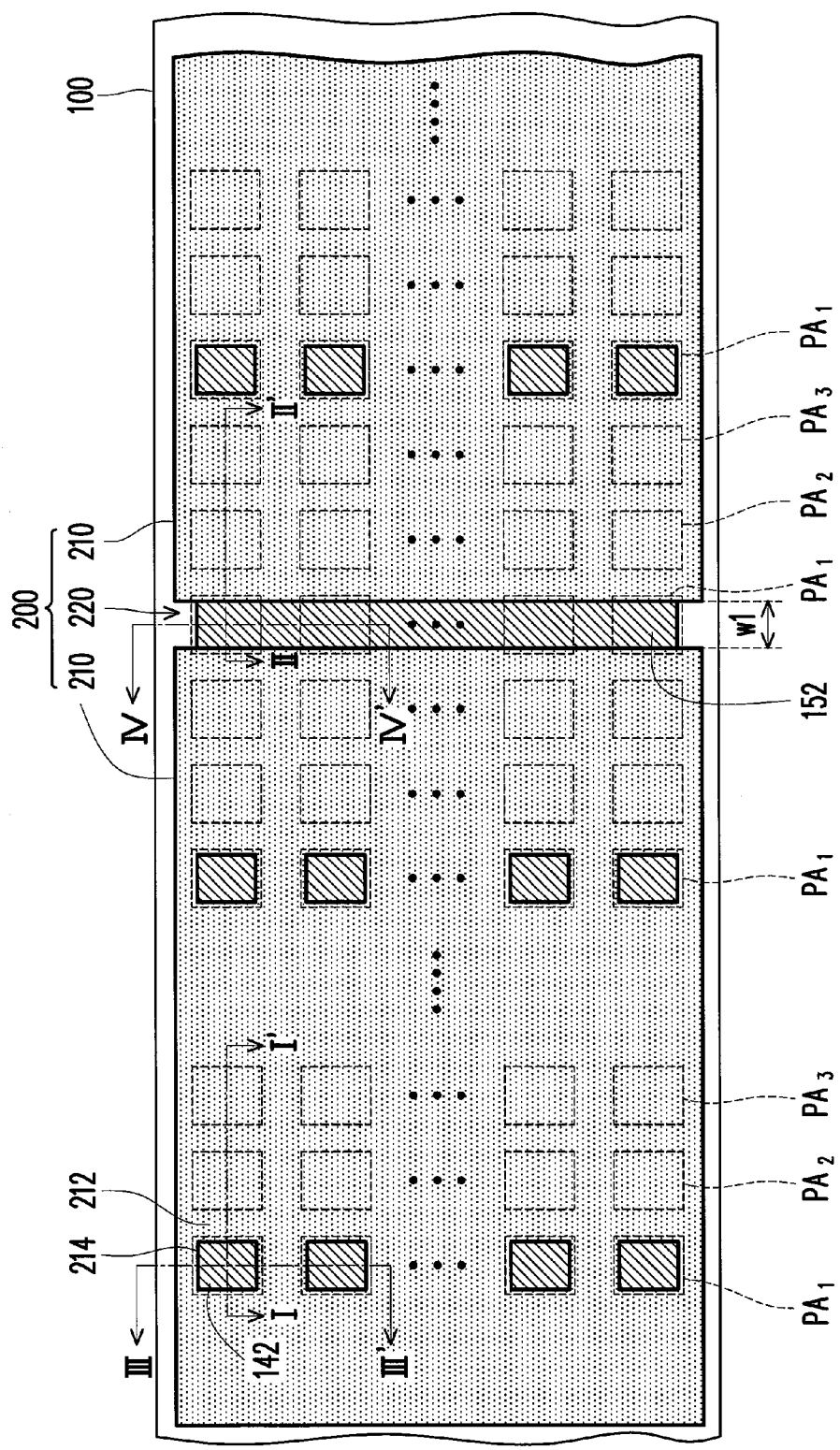
Figure 3C:
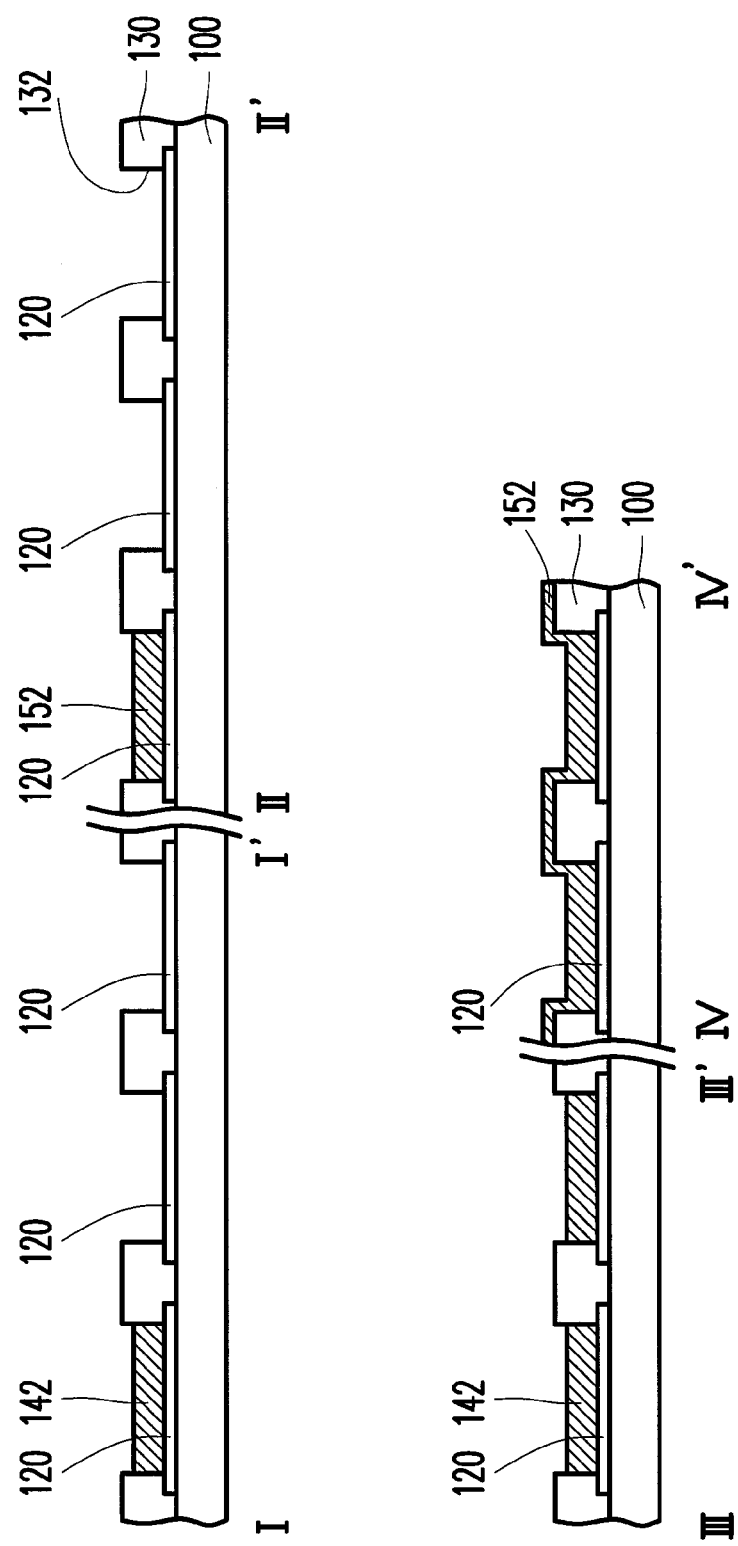

Referring to FIG. 2C and FIG. 3C, next, through the mask 200, a first structure layer 142 is formed in each sub-pixel area $PA_1$ corresponding to one opening 214, a first common structure layer 152 is formed in each plurality of first sub-pixel areas $PA_1$ in a same row corresponding to one gap 220. The first structure layer 142 and the first common structure layer 152 commonly act as an organic functional layer or an electrode layer. The organic functional layer includes a hole injection layer, an hole transport layer, an organic electro-luminescent layer, an electron injection layer, and an electron transport layer. In the present embodiment, each sub-mask unit 210 is described, as an example, as being disposed over n pixel areas 102. The first structure layer 142 is formed in each first sub-pixel areas PA1 of the n pixel areas 102, with the first structure layers 142 and the first sub-pixel areas PA1 being in a one-to-one correspondence relationship. The first common structure layer 152 is formed in the row of first sub-pixel areas $PA_1$ that is exposed through the gap 220. This row of first sub-pixel areas $PA_1$ is, for example, in pixel areas 102 such as the $(m+n)^{th}$ pixel area 102, the $(m+2n+1)^{th}$ pixel area 102, . . . , or the like. The first common structure layer 152 and the plurality of first sub-pixel areas $PA_1$ are in a one-to-more correspondence relationship. In the present embodiment, the first structure layers 142 are, for example, arranged in an island-like pattern in the row direction so as to be disposed in the first sub-pixel areas $PA_1$, respectively. The first common structure layer 152 is, for example, strip-shaped and extends in the row direction so as to be disposed in the plurality of first sub-pixel areas $PA_1$. The width w1 of the first common structure layer 152, for example, corresponds to the width w4 of the gap 220 and ranges, for example, substantially from 120 um to 125 um. In the present embodiment, the first structure layer 142 and the first common structure layer 152 act, for example, as an organic functional layer, and are formed using, for example, an evaporation process or a sputtering process. For example, in the present embodiment, a first color evaporation material (for example, red evaporation material) is used to form the first structure layer 142 and the first common structure layer 152 to form red electro-luminescent layers.

Figure 2D:
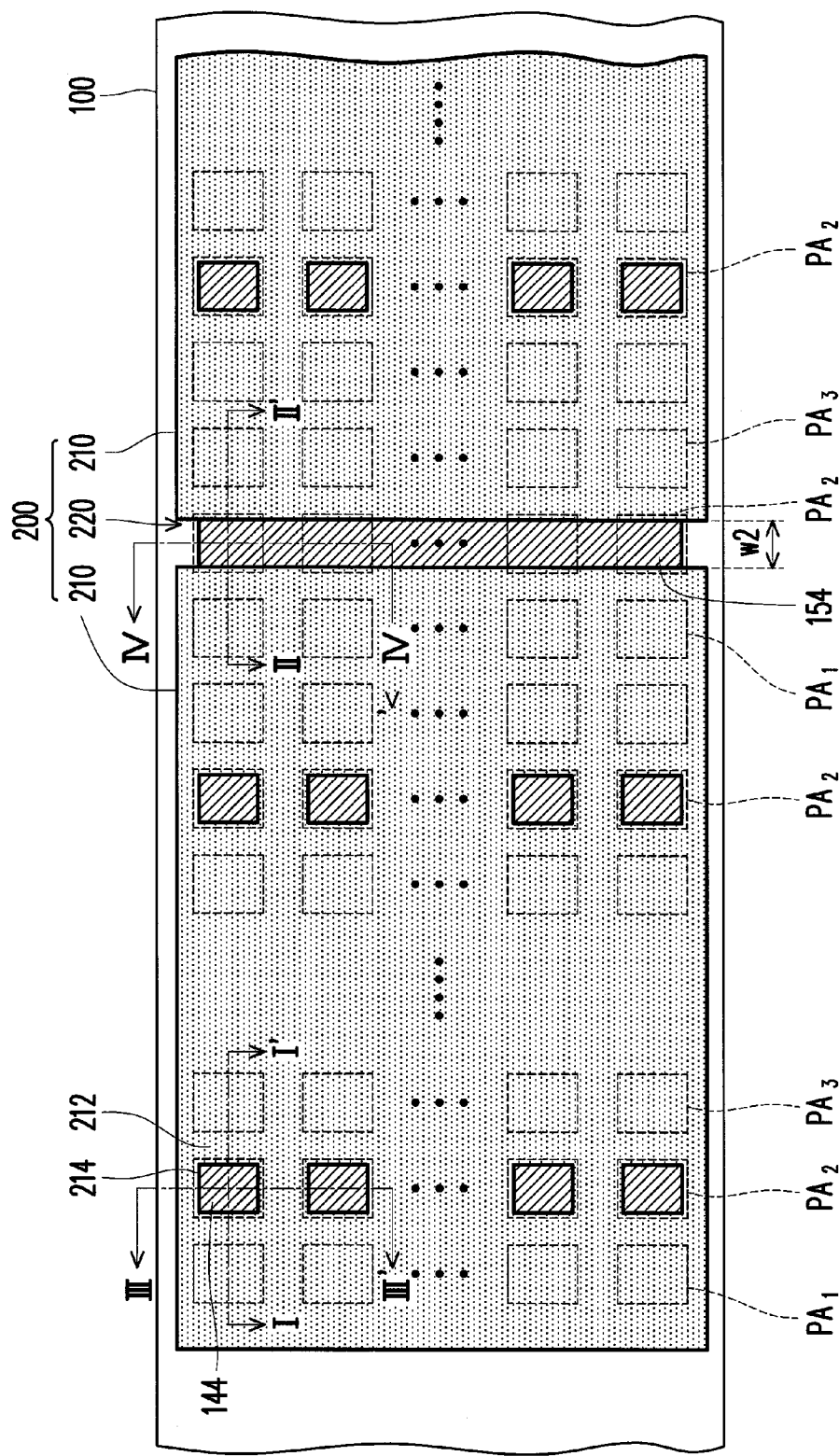
Figure 3D:
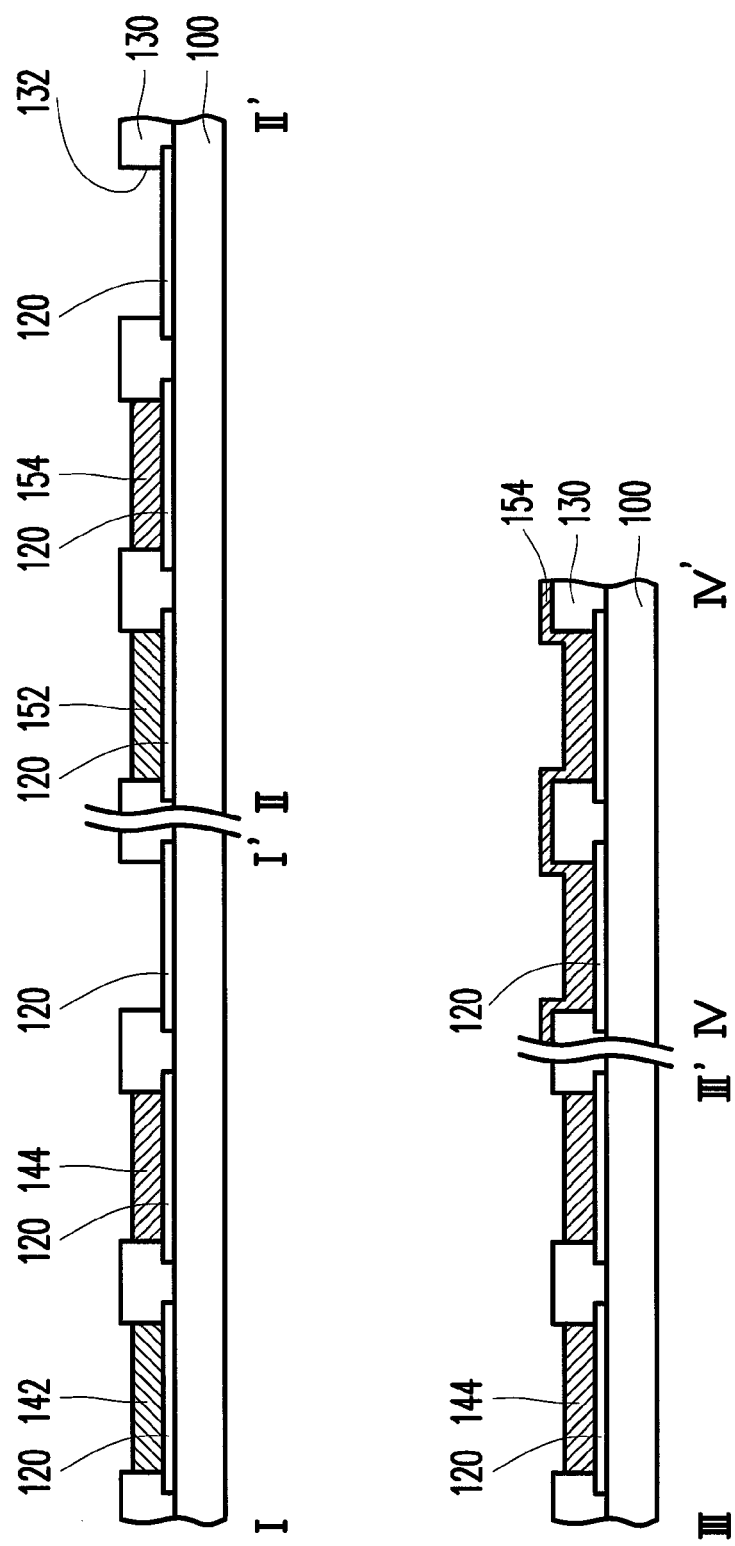

Referring to FIGS. 2D and 3D, in the present embodiment, after the formation of the first structure layer 142 and the first common structure layer 152, the mask 200 is moved such that the main body 212 of the mask 200 shields the first sub-pixel areas $PA_1$ and the third sub-pixel areas $PA_3$, with the openings 214 exposing the second sub-pixel areas $PA_2$ corresponding to the openings 214, and the gap 220 exposing the plurality of second sub-pixel areas $PA_2$ in a same row corresponding to the gap 220. Then, through the mask 200, a second structure layer 144 is formed in each second sub-pixel area $PA_2$ corresponding to one opening 214, a second common structure layer 154 is formed in each plurality of second sub-pixel areas $PA_2$ in a same row corresponding to one gap 220. The second structure layer 144 and the second common structure layer 154 commonly act as an organic functional layer or an electrode layer. The organic functional layer includes a hole injection layer, a hole transport layer, an organic electro-luminescent layer, an electron injection layer, and an electron transport layer. The electrode layer includes a cathode layer and an anode layer.

In the present embodiment, each sub-mask unit 210 is described, as an example, as being disposed over n pixel areas 102. The structure layer 144 is formed in each second sub-pixel area $PA_2$ of the n pixel areas 102, with the structure layers 144 and the second sub-pixel areas $PA_2$ being in a one-to-one correspondence relationship. The second common structure layer 154 is formed in the row of second sub-pixel areas $PA_2$ that is exposed through the gap 220. This row of second sub-pixel areas $PA_2$ is, for example, in pixel areas 102 such as the $(m+n)^{th}$ pixel area 102, the $(m+2n+1)^{th}$ pixel area 102, . . . , or the like. The second common structure layer 154 and the plurality of second sub-pixel areas $PA_2$ are in a one-to-more correspondence relationship. In the present embodiment, the second structure layers 144 are arranged in an island-like pattern in the row direction, for example, so as to be disposed in the second sub-pixel areas $PA_2$, respectively. The second common structure layer 154 is, for example, strip-shaped and extends in the row direction so as to be disposed in the plurality of second sub-pixel areas $PA_2$. The width w2 of the second common structure layer 154 corresponds, for example, to the width w4 of the gap 220 and ranges, for example, substantially from 120 um to 125 um. In the present embodiment, the second structure layer 144 and the second common structure layer 154 act, for example, as an organic functional layer, and are formed using, for example, an evaporation process or a sputtering process. For example, in the present embodiment, a second color evaporation material (for example, green evaporation material) is used to form the second structure layer 144 and the second common structure layer 154 to form green electro-luminescent layers.

Figure 2E:
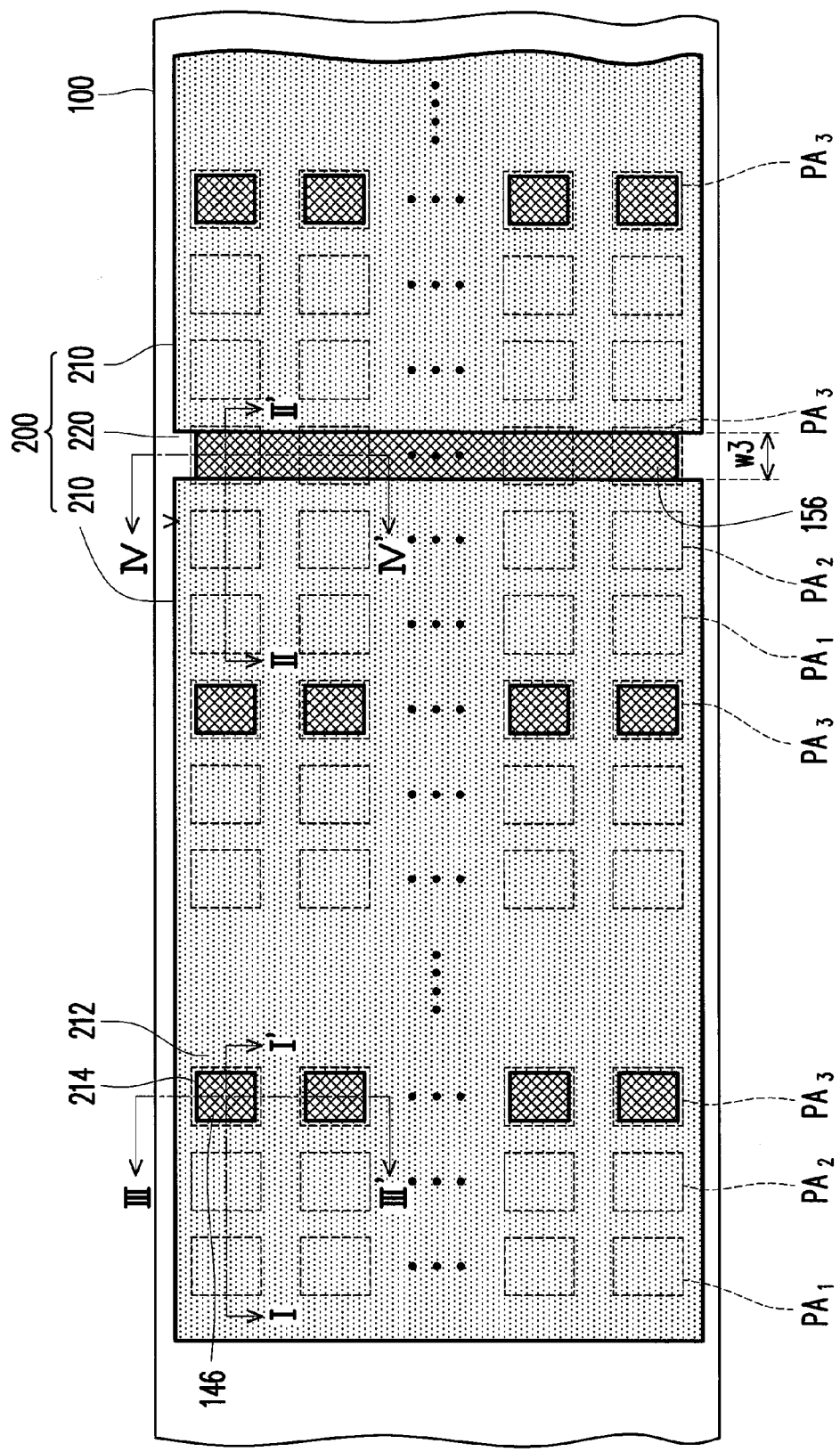
Figure 3E:
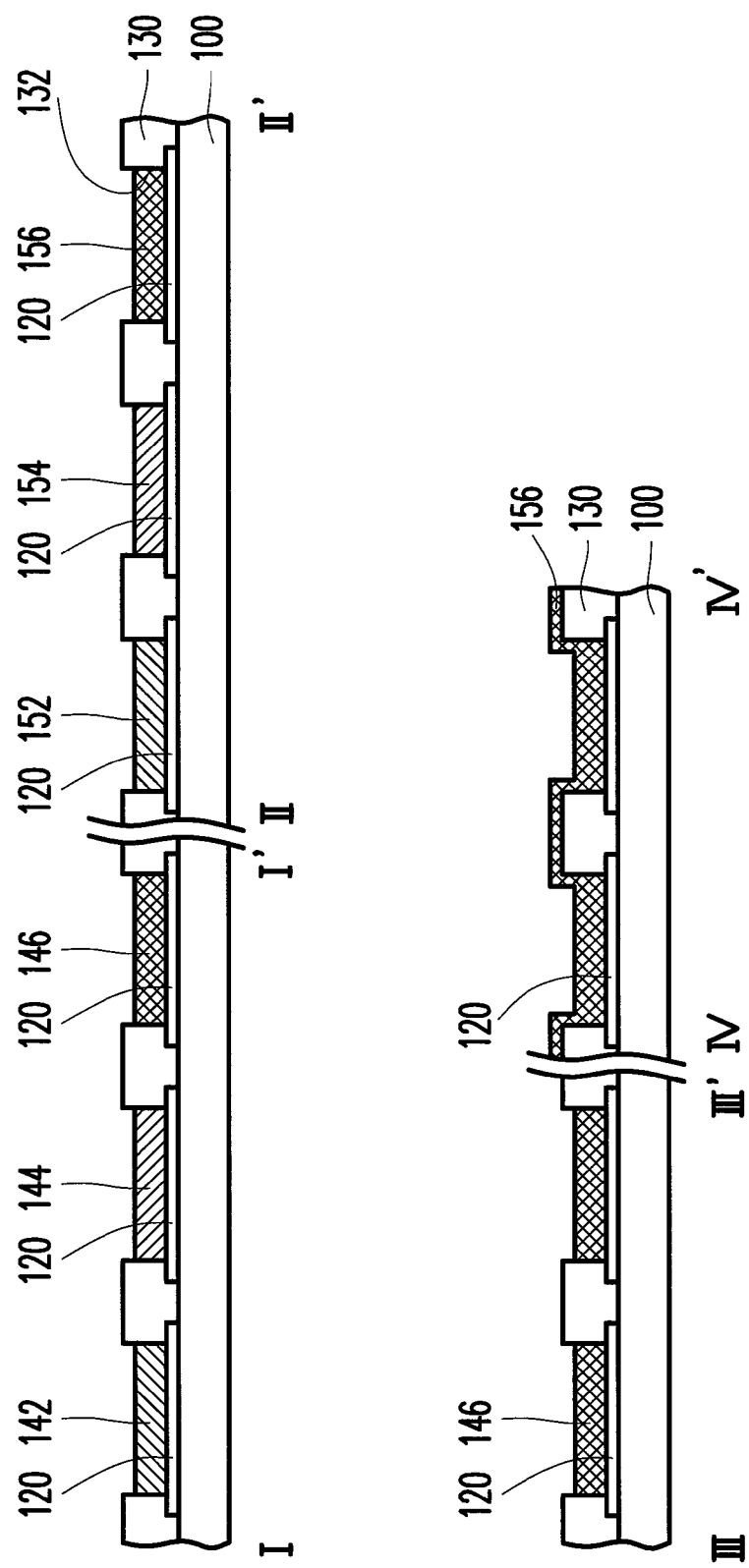

Referring to FIGS. 2E and 3E, in the present embodiment, after the formation of the second structure layer 144 and the second common structure layer 154, the mask 200 is moved such that the main body 212 of the mask 200 shields the first sub-pixel areas $PA_1$ and the second sub-pixel areas $PA_2$, with the openings 214 exposing the third sub-pixel areas $PA_3$ corresponding to the openings 214, and the gap 220 exposing the plurality of third sub-pixel areas $PA_3$ in a same row corresponding to the gap 220. Then, through the mask 200, a third structure layer 146 is formed in each third sub-pixel area $PA_3$ corresponding to one opening 214, a third common structure layer 156 is formed in each plurality of third sub-pixel areas $PA_3$ in a same row corresponding to one gap 220. The third structure layer 146 and the third common structure layer 156 commonly act as an organic functional layer or an electrode layer. The organic functional layer includes a hole injection layer, a hole transport layer, an organic electro-luminescent layer, an electron injection layer, and an electron transport layer. The electrode layer includes a cathode layer and an anode layer.

In the present embodiment, each sub-mask unit 210 is described, as an example, as being disposed over n pixel areas 102. The structure layer 146 is formed in each third sub-pixel area $PA_3$ of the n pixel areas 102, with the structure layers 146 and the third sub-pixel areas $PA_3$ being in a one-to-one correspondence relationship. The third common structure layer 156 is formed in the row of third sub-pixel areas $PA_3$ that is exposed through the gap 220. This row of third sub-pixel areas $PA_3$ is, for example, in pixel areas 102 such as the $(m+n)^{th}$ pixel area 102, the $(m+2n+1)^{th}$ pixel area 102, . . . , or the like. The third common structure layer 156 and the plurality of third sub-pixel areas $PA_3$ are in a one-to-more correspondence relationship. In the present embodiment, the third structure layers 146 are, for example, arranged in an island-like pattern in the row direction so as to be disposed in the third sub-pixel areas $PA_3$, respectively. The third common structure layer 156 is, for example, strip-shaped and extends in the row direction so as to be disposed in the plurality of third sub-pixel areas $PA_3$. The width w3 of the third common structure layer 156, for example, corresponds to the width w4 of the gap 220 and ranges, for example, substantially from 120 um to 125 um. In the present embodiment, the third structure layer 146 and the third common structure layer 156 act, for example, as an organic functional layer, and are formed using, for example, an evaporation process or a sputtering process. For example, in the present embodiment, a third color evaporation material (for example, blue evaporation material) is used to form the third structure layer 144 and the third common structure layer 156 to form a blue electro-luminescent layer.

Figure 2F:
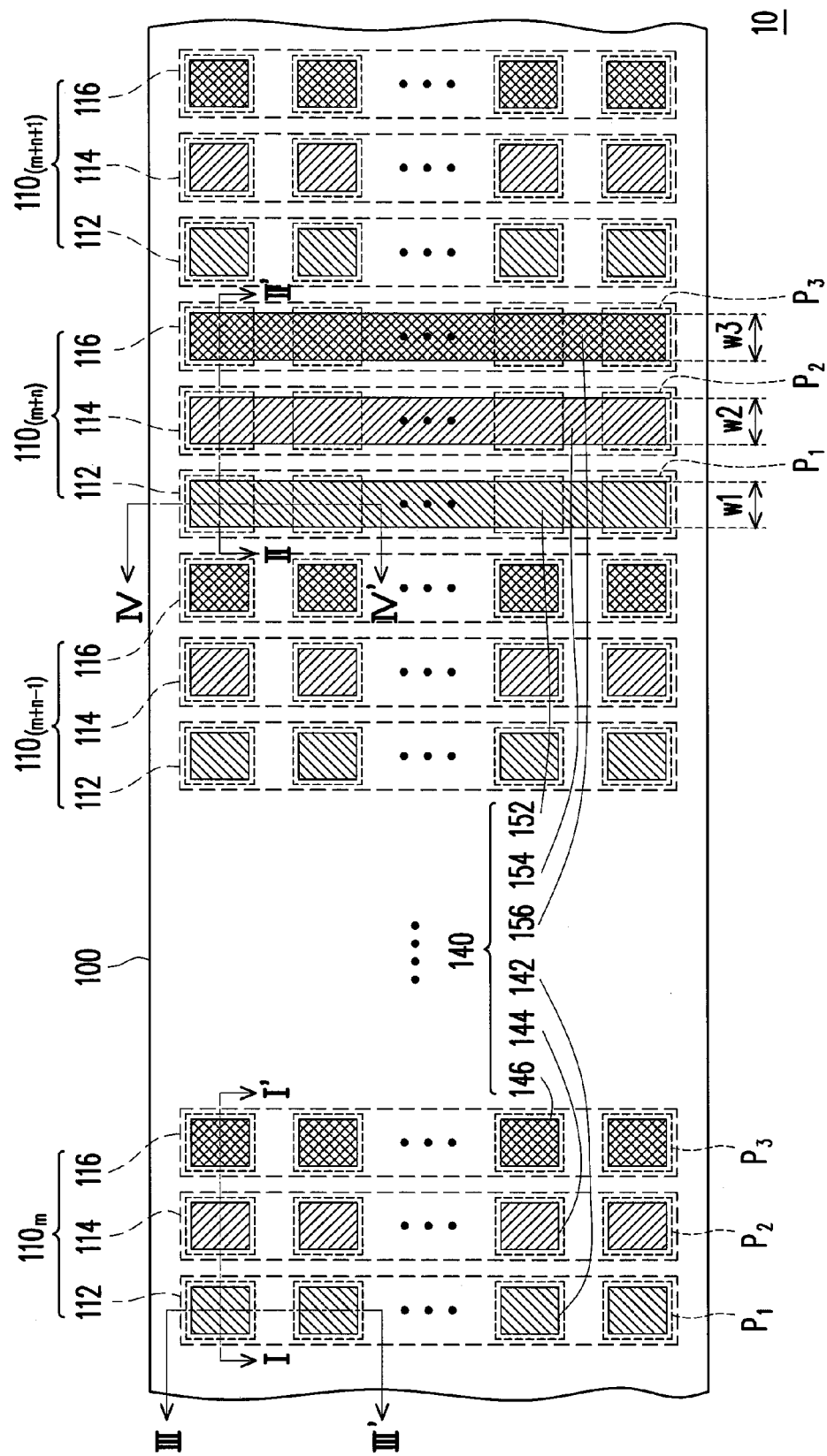
Figure 3F:
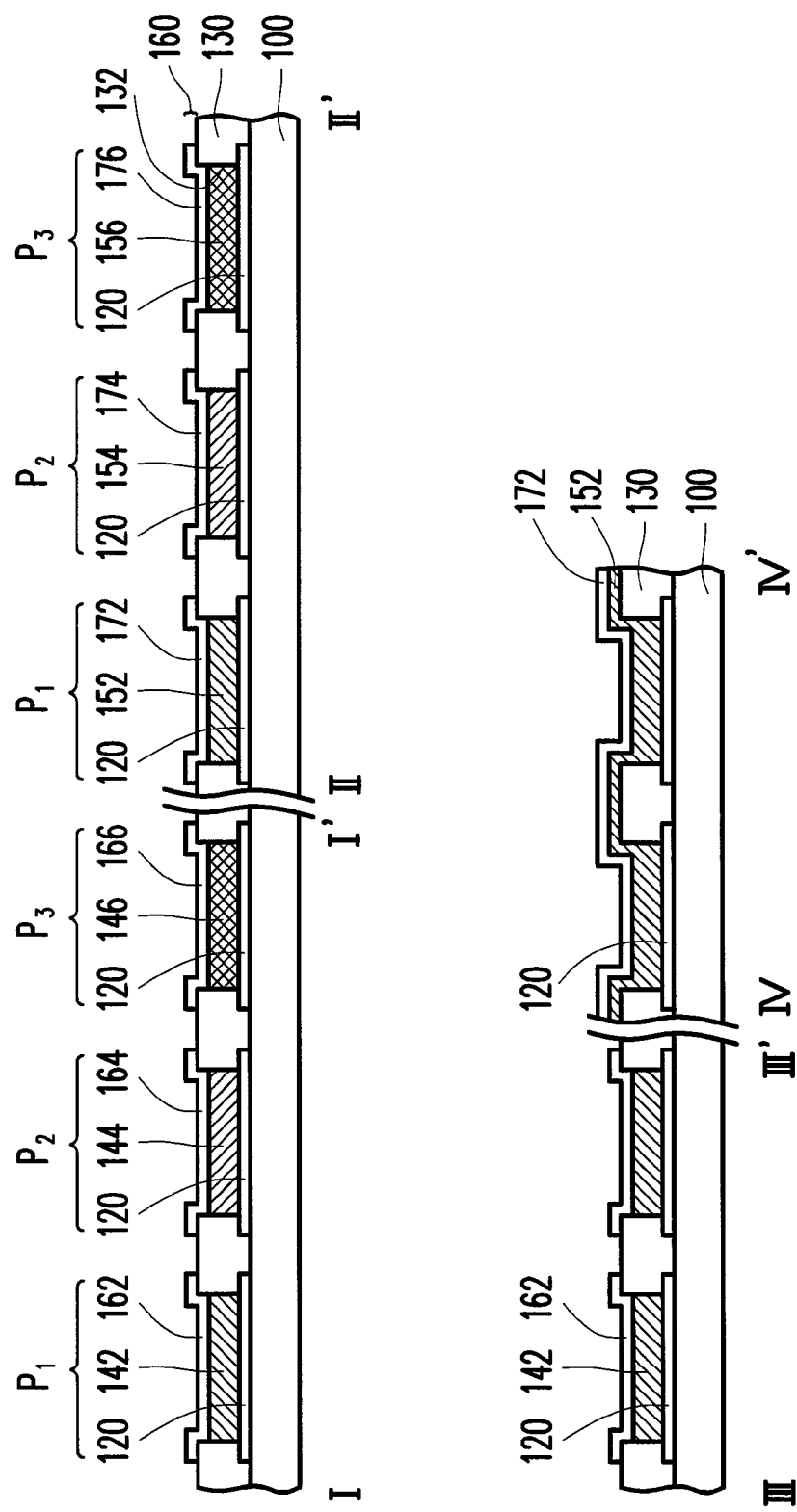

Referring to FIG. 2F and FIG. 3F, in the present embodiment, the structure layers 142, 144, 146 and the common structure layers 152, 154, 156 form the organic functional layer 140. The first common structure layer 152, the second common structure layer 154, and the third common structure layer 156 are, for example, connected with each other to have an total width ranging substantially from 360 um to 375 um. While the organic functional layer 140 is described as an organic electro-luminescent layer in the present embodiment, it is noted that the organic functional layer 140 may be a multilayer structure including such as a hole injection layer, an hole transport layer, an organic electro-luminescent layer, an electron injection layer, and an electron transport layer. In other words, the mask 200 may be used to form multiple films of the light emitting device.

Then, an electrode layer 160 is formed over the structure layers 142, 144, 146 and the common structure layers 152, 154, 156. In the present embodiment, the electrode layer 160 can be formed using the mask 200 and can be formed in a similar manner as described with respect to the structure layers 142, 144, 146 and the common structure layers 152, 154, 156 and, therefore, explanation of the forming process is not repeated. In the present embodiment, the electrode layer 160 includes, for example, structure layers 162, 164, 166 and common structure layers 172, 174, 176 over the structure layers 142, 144, 146 and the common structure layers 152, 154, 156, respectively. In other words, the structure layers 162, 164, 166 are arranged, for example, in an island-like pattern in the row direction so as each being disposed in corresponding sub-pixel area $PA_1$, $PA_2$, $PA_3$. The common structure layers 172, 174, 176 are, for example, strip-shaped and extends in the row direction so as each being disposed in a plurality of sub-pixel areas $PA_1$, $PA_2$, $PA_3$. The width of each of the common structure layers 172, 174, 176 ranges, for example, substantially from 120 um to 125 um, and the total width of the common structure layers 172, 174, 176 ranges, for example, substantially from 360 um to 375 um.

It is noted that, in the light emitting device 10, the electrode layer 120 is one of a cathode layer and an anode layer, while the electrode layer 160 is the other of the cathode layer and the anode layer. In the present embodiment, the cathode layer 120 is, for example, an anode layer, while the electrode layer 160 is the cathode layer. Furthermore, while it is illustrated in the present embodiment that the mask 200 is used to form the organic functional layer 140 and the electrode layer 160 of the light emitting device 10, it is noted that the mask 200 could be used to form at least one, at least two or at least three of the electrode layer 120, the organic functional layer 140 and the cathode layer 160. In other words, the mask 200 may be used to form at least one, at least two or at least three of the anode layer, the organic functional layer and the cathode layer of the light emitting device.

Taking FIG. 2B as an example, the width of the gap 220 between the sub-mask units 210 corresponds to the width of one sub-pixel area $PA_1$. Therefore, it is acceptable if the combination precision of the sub-mask units 210 can be controlled such that the gap 220 is within the range of the width of one sub-pixel area $PA_1$ +/−0.04 mm. In other words, the combination precision of the sub-mask units 210 can be relatively easily controlled. In addition, in the present embodiment, the edge portion 211 of the mask 200 shields at least two sub-pixel areas $PA_2$, $PA_3$. Therefore, the width (i.e. the distance between the edge of the sub-mask unit 210 and one opening 214 closest to the edge) of the edge portion 211 of the sub-mask unit 210 is substantially at least larger than the width of two sub-pixel areas $PA_2$, $PA_3$, for example, at least larger than or equal to 0.1 mm. For example, assuming the width of one sub-pixel area ranges from about 120 um to about 125 um, the width of the edge portion 211 of the sub-mask unit 210 would be at least larger than 240 um to 250 um. It is noted, however, the present invention is not intended to be limited to particular examples described herein and could vary depending upon actual requirements. Therefore, during the fabrication of the screen mask for the sub-mask units 210, it is acceptable if the fabrication precision for the edge portion 211 can be controlled such that the width of the edge portion 211 is less than or equal to the width of two sub-pixel areas $PA_2$, $PA_3$ +/−0.006-0.01 mm. In other words, the fabrication precision of the edge portion 211 of the sub-mask unit 210 can be relatively easily controlled. Besides, because the edge portion 211 of the sub-mask unit 210 is not too slim, the mask 200 has a good mask stretch stability thus avoiding mask deformation or tearing. Furthermore, the gap 220 between sub-mask units 210 is only required to correspond to one row of sub-pixel areas $PA_1$. Therefore, the mask 200 can be divided into sub-mask units 210 at appropriate locations to achieve symmetrical sub-mask units 210 and, as such, the fabrication cost of the mask 200 can be significantly reduced. Thus, the fabrication method of the light emitting device of the present invention can significantly reduce the time of fabricating the light emitting device and the fabrication cost of the mask, and lead to an improved yield of the fabricated light emitting devices.

In summary, in the light emitting device of the present invention, the structure layer and the common structure layer form an organic functional layer or an electrode layer. One structure layer corresponds to one sub-pixel, one common structure layer corresponds to a plurality of sub-pixels in a same row, and the common structure layers are, for example, arranged periodically. The method for fabricating the light emitting device uses a mask having a plurality of sub-mask units, with the gap between the sub-mask units corresponding to a row of sub-pixel areas. The sub-mask unit includes a plurality of openings to define the structure layers, and the gap between the sub-mask units is used to define the common structure layer. As such, the fabrication of the sub-mask units is made easier, and the combination precision of the sub-mask units can be relatively easily controlled. Therefore, the time of fabricating the light emitting device and the fabrication cost of the mask can be significantly reduced, and the fabricated light emitting devices has an improved yield.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for manufacturing a light emitting device, comprising:

providing a substrate, the substrate including a plurality of pixel areas, each of the pixel areas including a plurality of first sub-pixel areas arranged in row, a plurality of second sub-pixel areas arranged in row, and a plurality of third sub-pixel areas arranged in row;

providing a mask on the substrate, the mask including a plurality of sub-mask units and a gap formed between each two adjacent sub-mask units, each of the sub-mask units including a main body with a plurality of openings, the main body shielding the second sub-pixel areas and the third sub-pixel areas, the openings arranged in row, each opening exposing one first sub-pixel area corresponding to the opening, each gap exposing a plurality of first sub-pixel areas in a same row corresponding the gap, and the width of each gap being at least larger than 25 um; and through the mask, forming a first structure layer in each first sub-pixel area corresponding to one opening, and forming a first common structure layer in each plurality of first sub-pixel areas in a same row corresponding to one gap, and the first structure layer and the first common structure layer commonly acting as an organic functional layer or an electrode layer.

2. The method according to claim 1, wherein the width of each sub-mask unit ranges substantially from 50 mm to 580 mm.

3. The method according to claim 1, wherein the width of each gap ranges substantially from 120 um to 125 um.

4. The method according to claim 1, wherein the width of each opening ranges substantially from 120 um to 125 um.

5. The method according to claim 1, wherein the method for forming the first structure layers and the first common structure layer includes an evaporation process and a sputtering process.

6. The method according to claim 1, wherein the organic functional layer includes a hole injection layer, a hole transport layer, an organic electro-luminescent layer, an electron injection layer and an electron transport layer.

7. The method according to claim 1, wherein the electrode layer includes a cathode layer.

8. The method according to claim 1, wherein the electrode layer includes an anode layer.

9. The method according to claim 1, wherein, after forming the first structure layers and the first common structure layer, the method further comprises:

moving the mask such that the main body of the mask shields the first sub-pixel areas and the third sub-pixel areas, each opening exposing one second sub-pixel area corresponding to the opening, and each gap exposing a plurality of second sub-pixel areas in a same row corresponding to the gap; and through the mask, forming a second structure layer in each second sub-pixel area corresponding to one opening, and forming a second common structure layer in each plurality of second sub-pixel areas in a same row corresponding to one gap, and the second structure layer and the second common structure layer commonly acting as an organic functional layer or an electrode layer.

10. The method according to claim 1, wherein, after forming the first structure layers and the first common structure layer, the method further comprises:

moving the mask such that the main body of the mask shields the first sub-pixel areas and the second sub-pixel areas, each opening exposing one third sub-pixel area corresponding to the opening, and each gap exposing a plurality of third sub-pixel areas in a same row corresponding to the gap; and through the mask, forming a third structure layer in each third sub-pixel area corresponding to one opening, and forming a third common structure layer in each plurality of third sub-pixel areas in a same row corresponding to one gap, and the third structure layer and the third common structure layer commonly acting as an organic functional layer or an electrode layer.

* * * * *